(12) United States Patent
Liu

(10) Patent No.: US 8,587,482 B2
(45) Date of Patent: Nov. 19, 2013

(54) LAMINATED ANTENNA STRUCTURES FOR PACKAGE APPLICATIONS

(75) Inventor: Duixian Liu, Scarsdale, NY (US)

(73) Assignee: International Business Machines Corporation, Armonk, NY (US)

(*) Notice: Subject to any disclaimer, the term of this patent is extended or adjusted under 35 U.S.C. 154(b) by 363 days.

(21) Appl. No.: 13/011,441

(22) Filed: Jan. 21, 2011

(65) Prior Publication Data

US 2012/0188138 A1 Jul. 26, 2012

(51) Int. Cl.
*H01Q 1/38* (2006.01)
(52) U.S. Cl.
USPC .................................. 343/700 MS; 343/776
(58) Field of Classification Search
USPC ............................ 343/700 MS, 772, 776, 777
See application file for complete search history.

(56) References Cited

U.S. PATENT DOCUMENTS

| | | | |
|---|---|---|---|
| 5,043,738 A | 8/1991 | Shapiro et al. | |
| 6,791,438 B2 | 9/2004 | Takahashi et al. | |
| 7,391,372 B2 | 6/2008 | Lynch et al. | |
| 7,675,466 B2 | 3/2010 | Gaucher et al. | |
| 2003/0067410 A1* | 4/2003 | Puzella et al. | 343/700 MS |
| 2007/0132642 A1 | 6/2007 | Iluz et al. | |
| 2007/0229182 A1 | 10/2007 | Gaucher et al. | |
| 2008/0129453 A1 | 6/2008 | Shanks et al. | |
| 2009/0207080 A1 | 8/2009 | Floyd et al. | |
| 2009/0256752 A1 | 10/2009 | Akkermans et al. | |
| 2010/0001906 A1 | 1/2010 | Akkermans et al. | |
| 2010/0033393 A1 | 2/2010 | Myszne et al. | |
| 2010/0190464 A1 | 7/2010 | Chen et al. | |
| 2010/0327068 A1 | 12/2010 | Chen et al. | |

FOREIGN PATENT DOCUMENTS

| | | |
|---|---|---|
| TW | 200952251 | 12/2009 |
| TW | 201011984 | 3/2010 |
| WO | 2009/105146 A1 | 8/2009 |
| WO | 2009/128866 A1 | 10/2009 |

OTHER PUBLICATIONS

International Search Report and Written Opinion of the International Search Authority dated Mar. 15, 2012, PCTUS12/20639.
H. Uchimura et al., "A Ceramic Planar 77GHz Antenna Array," 1999 IEEE MTT-S International Microwave Symposium Digest, Jun. 1999, pp. 453-456.
Xin Wang et al., "A 79 Ghz LTCC Differential Microstrip Line to Laminated Waveguide Transition Using High Permittivity Material," Microwave Conference Proceedings (APMC), Dec. 2010, 4 pages.
Taras Kushta et al., "High Isolated and High-Performance Vertical Transitions for Multilayer Printed Circuit Boards," Proceedings of International Symposium on Electromagnetic Compatibility, 2004, pp. 57-60, vol. 1.
Communication dated Jul. 11, 2013 from German Patent office for counterpart application 11 2012 000 285.7.

* cited by examiner

*Primary Examiner* — Hoanganh Le
(74) *Attorney, Agent, or Firm* — Anne V. Dougherty; Ryan, Mason & Lewis, LLP

(57) ABSTRACT

Apparatus and methods for packaging IC chips and laminated antenna structures with laminated waveguide structures that are integrally constructed as part of an antenna package to form compact integrated radio/wireless communications systems for millimeter wave applications.

25 Claims, 7 Drawing Sheets

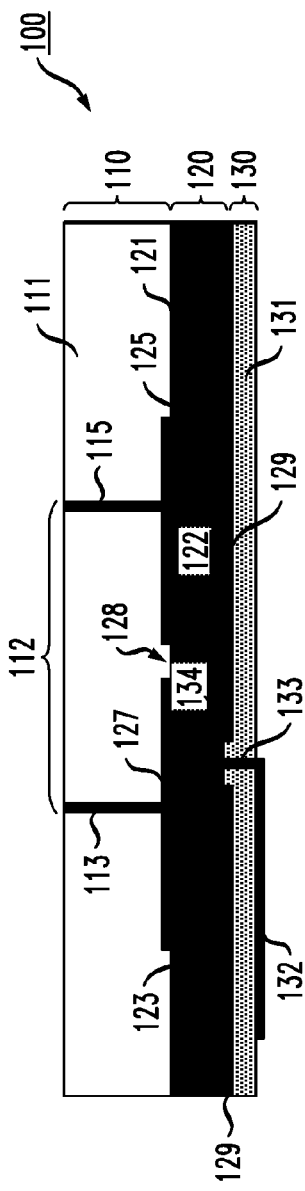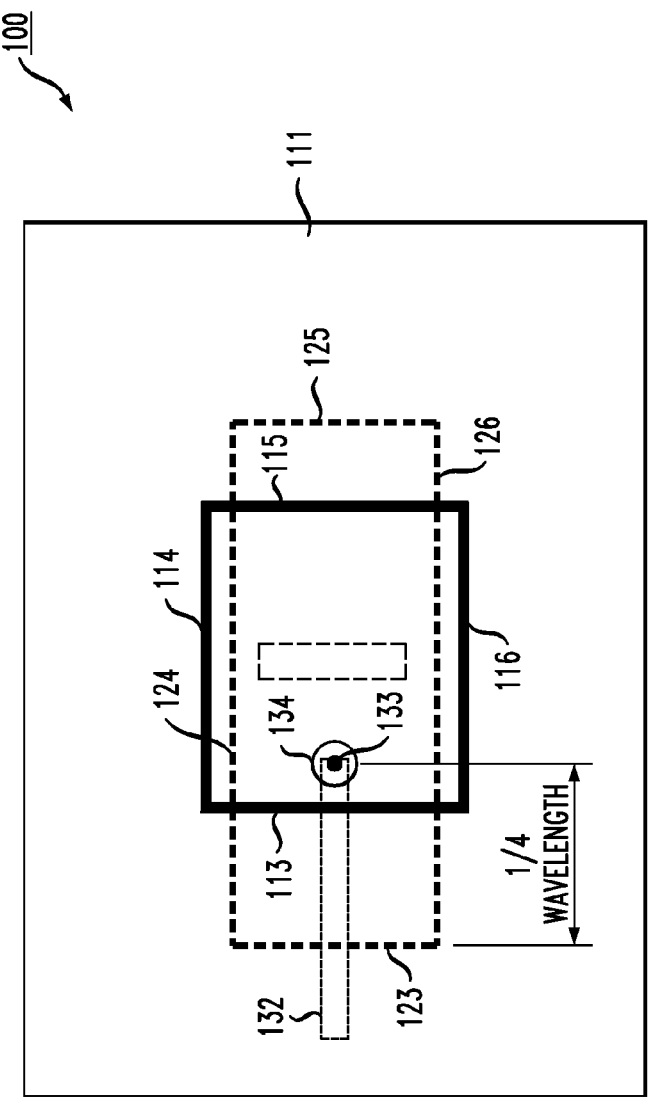
FIG. 1A
FIG. 1B

LAMINATED ANTENNA STRUCTURES FOR PACKAGE APPLICATIONS

TECHNICAL FIELD

The present invention generally relates to apparatus and methods for integrally packaging antenna devices with semiconductor IC (integrated circuit) chips and, in particular, apparatus and methods for packaging IC chips and laminated antenna structures with laminated waveguide structures that are integrally constructed as part of an antenna package to form compact integrated radio/wireless communications systems for millimeter wave applications.

BACKGROUND

In a wireless network, the connectivity and communication between devices is achieved through antennas attached to receivers or transmitters, in order to radiate the desired signals to or from other elements of the network. In radio communication systems, such as millimeter-wave radios, discrete components are usually assembled with low integration levels. These systems are often assembled using expensive and bulky waveguides and package-level or board-level microstrip structures to interconnect semiconductors and their required transmitter- or receiver-antennas. With recent progress in semiconductor technology and packaging engineering, the dimensions of these radio communication systems have become smaller. For applications such as wireless universal serial bus (USB), the operating distance is limited to about a meter; and a single antenna with about 7 dBi at 60 GHz will provide the necessary antenna gain. For distances as long as 10 meters (such as wireless video) or longer (such as radar), in point-to-point applications, antenna gains as high as 30 dBi, depending on the application, are required. However, high gain antennas for wireless video applications have very narrow beam widths, so pointing the antenna is very difficult for consumers. And line-of-sight signal transmission cannot be guaranteed in indoor environments because of, e.g., people moving around within the indoor environment. Therefore, a radiation pattern steerable array, such as a phased array, is necessary to help beam alignment and/or to find other signal transmission pass in case of blockage. Phased arrays are also widely used in military radars. However, packaging RF chips with integrated antennas or phased arrays is extremely difficult and very expensive due to the expensive components and extensive labor involved.

SUMMARY

In general, exemplary embodiments of the invention include apparatus and methods for integrally packaging antenna devices with semiconductor IC (integrated circuit) chips and, in particular, apparatus and methods for packaging IC chips and laminated antenna structures with laminated waveguide structures that are integrally constructed as part of a antenna package to thereby form compact integrated radio/wireless communications systems for millimeter wave applications.

For example, in one exemplary embodiment, an antenna package includes a first package level comprising a laminated antenna, a second package level comprising a laminated waveguide for coupling energy to the laminated antenna, and a third package level comprising an antenna feed line, wherein a vertical probe connected to an end of the antenna feed line to couple energy from the antenna feed line to the laminated waveguide. In one embodiment, the laminated antenna comprises a filled-cavity antenna structure wherein energy is coupled to the antenna through an aperture formed in a metallic wall of the waveguide. In other exemplary embodiments, vertical metallic walls of the laminated antenna and waveguides are defined by a plurality of metallic vias.

In other exemplary embodiments of an antenna package, the antenna feed line may be a single microstrip line with one vertical probe that extends into the laminated waveguide through an aperture formed in a bottom wall of the laminated waveguide, or the antenna feed line may be a differential feed line having two vertical probes that extend from each respective end of the differential feed line into the laminated waveguide through separate apertures formed in a bottom wall of the laminated waveguide.

In other exemplary embodiments of an antenna package, a fourth package level may be included which comprises a plurality of metallic traces and vertical vias to implement power supply and control signal lines for interfacing to an integrated circuit chip.

In another exemplary embodiment, an integrated circuit chip package includes an antenna package having a first package level comprising a laminated antenna, a second package level comprising a laminated waveguide for coupling energy to the laminated antenna, a third package level comprising an antenna feed line, a vertical probe connected to an end of the antenna feed line to couple energy from the antenna feed line to the laminated waveguide, and an integrated circuit chip flip chip bonded the antenna feed line of the third package level.

In yet another exemplary embodiment of an integrated circuit chip package, a fourth package level may be included comprising a plurality of metallic traces and vertical vias to implement power supply and control signal lines for interfacing the integrated circuit chip to a printed circuit board, wherein the integrated circuit chip is disposed in a cut out region of the printed circuit board.

In yet another exemplary embodiment of the invention, an antenna array package includes a first package level comprising an array of laminated antennas, a second package level comprising an array of laminated waveguides, each laminated waveguide being separately formed and disposed for coupling energy to a respective one of the laminated antennas, and a third package level comprising a plurality of antenna feed lines each having a vertical probe connected to an end thereof to couple energy from the antenna feed line to a respective one of the laminated waveguides. Each of the laminated antennas may comprise filled-cavity antenna structures.

In other exemplary embodiments of an antenna array package, each antenna feed line may be a single microstrip line with one vertical probe that extends into a respective one of the laminated waveguides through an aperture formed in a bottom wall of the laminated waveguide, or each antenna feed line may be a differential feed line having two vertical probes that extend from each respective end of the differential feed line into a respective one of the laminated waveguides through separate apertures formed in a bottom wall of the laminated waveguide.

In another exemplary embodiment of an antenna array package, the array of laminated antennas may be arranged in a rectangular array, or arranged in a triangular lattice shaped array. In yet another exemplary embodiment, an integrated circuit chip is flip chip bonded to each of the antenna feed lines of the third package level of the antenna array package.

These and other exemplary embodiments, aspects, features and advantages of the present invention will be described or become apparent from the following detailed description of exemplary embodiments, which is to be read in connection with the accompanying drawings.

BRIEF DESCRIPTION OF THE DRAWINGS

FIGS. 1A and 1B schematically depict an antenna package according to an exemplary embodiment of the invention.

DETAILED DESCRIPTION OF EXEMPLARY EMBODIMENTS

Figure 2A:
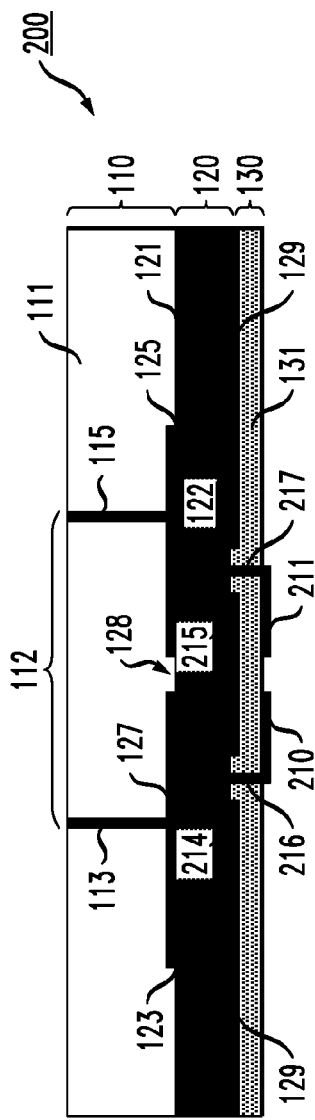
FIGS. 2A and 2B schematically depict an antenna package according to another exemplary embodiment of the invention.

In general, exemplary embodiments described herein include apparatus and methods for integrally packaging antenna devices with semiconductor IC (integrated circuit) chips and, in particular, apparatus and methods for packaging IC chips and laminated antenna structures with laminated waveguide structures that are integrally constructed as part of an antenna package to thereby form compact integrated radio/wireless communications systems for millimeter wave applications. Exemplary embodiments provide apparatus and methods for low cost packages with integrated antennas or phased arrays operating in the millimeter wave (mmWave) range.

For example, FIGS. 1A and 1B schematically depict an antenna package according to an exemplary embodiment of the invention. More specifically, FIG. 1A schematically depicts a cross sectional view of an antenna package (100) comprising a plurality of package levels (110), (120) and (130), and FIG. 1B schematically depicts a top plan view of the exemplary package (100) of FIG. 1A. Referring to FIG. 1A, the antenna package (100) generally comprises a first package level (110) comprising one or more layers of insulating (or dielectric) material (111) and an antenna structure (112) embedded in the insulating material (111). The antenna package (100) further comprises a second package level (120) comprising one or more layers of insulating (or dielectric) material (121) and a waveguide structure (122) embedded in the insulating material (121). In addition, the antenna package (100) comprises a third package level (130) comprising one or more layers of insulating (or dielectric material) (131) with an antenna feed line (132) and probe (133).

As shown in FIGS. 1A and 1B, the antenna (112) is rectangular shaped having metallic side walls (113), (114), (115), and (116) which surround dielectric material (111) within the perimeter. The antenna (112) can be referred to as a filled-cavity antenna. In general, the resonant frequency of the antenna (112) is a function of the length, width and depth of the structure, as well as the dielectric constant of the insulating material (111).

As further shown in FIGS. 1A and 1B, the waveguide (122) is rectangular shaped having metallic side walls (123), (124), (125), and (126) and a top wall (127) and bottom wall (129). An aperture (128) (slot) is formed in the top wall (127) of the waveguide (122) to couple electromagnetic energy from the waveguide (122) to the antenna (112). An aperture (134) is also formed in the bottom wall (129) of the waveguide (122) to insertably receive a probe (133) that is connected to the end of a transmission line (132). It is to be understood that the waveguide (122), aperture (128) and transmission line (132) are shown in phantom in FIG. 1B.

For package applications, RF energy from an RFIC chip is fed to the antenna through the transmission line (132) (e.g., a microstrip line or co-planar waveguide line) and then coupled into the waveguide (122) by the probe (133) which serves as a vertical transition from the feed line (132) to the waveguide (122). The waveguide bottom wall (129) serves as a ground plane for the transmission line (132). For efficient coupling of energy from the vertical transition (probe) (133), the centerline of the probe (133) extending through the aperture (134) in bottom wall (129) of the waveguide is disposed about ¼ wavelength to the left of the sidewall (123) of the waveguide (122).

Figure 2B:
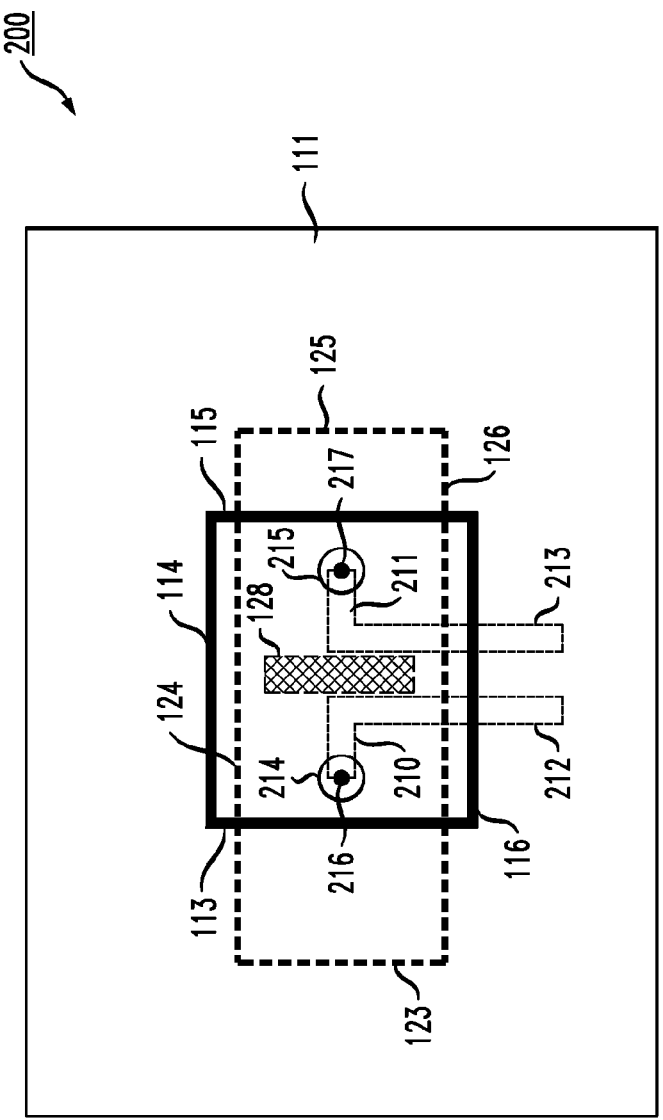

FIGS. 1A and 1B schematically illustrate an integrated antenna structure (100) with a single-ended feed (e.g., microstrip feed 132), according to an aspect of the invention. In some applications, such as with RF transmitters, a differential-feed antenna structures is desirable. FIGS. 2A and 2B schematically depict an antenna package according (200) to another exemplary embodiment of the invention. More specifically, FIG. 2A schematically depicts a cross sectional view of an antenna package (200) comprising a plurality of package levels (110), (120) and (130) similar to that of FIG. 1A, and FIG. 2B schematically depicts a top plan view of the exemplary package (200) of FIG. 2A. The antenna structure (200) of FIGS. 2A and 2B is similar to that of FIGS. 1A and 1B except that the feed line package layer (130) comprises a differential feed line structure comprising feed lines (212) and (213). The differential feed lines (212) and (213) transition to respective probes (216) and (217) by feed lines (210) and (211), respectively. In the exemplary structure (200), two apertures (214) and (215) are formed in the bottom wall (129) of the waveguide (122) to insertably receive respective probes (216) and (217). In other embodiments, a balun structure may be formed with package layer (130) to convert a single-ended feed to a differential feed. As is well-known to the skilled artisan, a balun can convert differential signals to signals that are unbalanced (single-ended) and vice versa.

It is to be understood that integrated antenna structures according to exemplary embodiments as discussed herein may be constructed using various known processes. For instance, multilayer integrated antenna structures can be fabricated using multilayered printed circuit boards (PCB) or using low temperature cofired ceramic (LTCC) technology. In the exemplary antenna structures 100 and 200 discussed above, the side walls of the antenna (112) and waveguide (122) are depicted as solid vertical metallic walls, but in practice, solid vertical metal walls typically cannot be manufactured. Instead, in some exemplary embodiments, the vertical side walls of the antenna (112) and waveguide (122) may be formed from via holes that are plated or filled with metallic material such as copper.

Figures 3A, 3B:
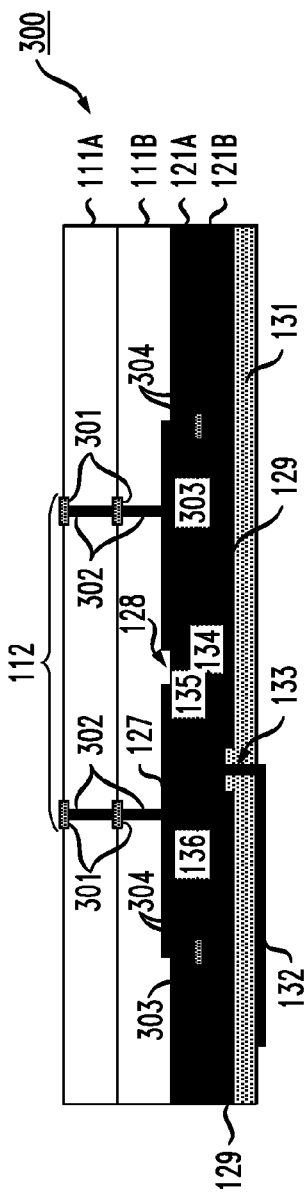
FIGS. 3A and 3B schematically depict an antenna package according to another exemplary embodiment of the invention.

For instance, FIGS. 3A and 3B schematically depict an antenna package according to another exemplary embodiment of the invention which may be fabricated using LTCC technology. More specifically, FIG. 3A schematically depicts a cross sectional view of an antenna package (300) comprising a plurality of package levels (110), (120) and (130), and FIG. 3B schematically depicts a top plan view of the exemplary package (300) of FIG. 3A. The antenna package (300) is similar to the antenna package (100) of FIGS. 1A and 1B, but showing vertical walls of the antenna (112) being formed by filled via holes (302) and metallic patterned rings (301). Similarly, vertical walls of the waveguide (122) are formed by metallic-filled or plated via holes (304) and metallic patterned rings (303). In the exemplary embodiment of FIG. 3A, the first package level (110) is shown to comprise two layers of insulating (or dielectric) material (111a, 111b) and the second package level (120) is shown to comprises two layers of insulating (or dielectric) material (121a, 121b).

The antenna package (300) can be fabricated using lamination technology for co-firing ceramics where the various layers are formed using glass ceramics to form a ceramic package. As each layer is formed, metallic material is deposited and patterned to form the planar elements such as the feed line (132), waveguide bottom wall (129) and top wall (127) and the metallic rings (303) and (301) defining the edges of the vertical walls of the waveguide structure (122) and antenna structure (112). The probe attached at the end of the transmission feed line (132) includes two via elements (133) and (136) coupled via a metallic pad (135) formed on layer 121b. The metallic rings (301) and (303) formed between layers of the various package levels (110) and (120) are optional and actually serve as alignment elements to electrically connect the various metallic filled via holes (302) and (304) that are vertically formed through each of the layers. In this regard, the vertical via holes (302) actually define the vertical walls of the antenna (112) formed in layers 111A and 111B, and the vertical via holes (304) actually define the vertical walls of the waveguide (122) formed in layers 121A and 121B. The vertical vias that define the antenna and waveguide side walls are spaced apart (pitch) at a distance that is less than one quarter wavelength of the desired operating frequency.

In other exemplary embodiments, the exemplary antenna package structures can be fabricated by bonding multiple layers of PCB together to form the various package levels. For instance, in FIG. 1A, each package level (110), (120) and (130) can be fabricated from a separate PCB and then bonded together to form the stacked antenna structure. In this exemplary embodiment, the thicknesses and dielectric materials of the different layers can be selected as desired and the vertical side walls of the antenna (112) and waveguide (122) can be formed by drilling a pattern of via holes through each layer and plating the via holes with metallic material such as copper.

Figure 4:
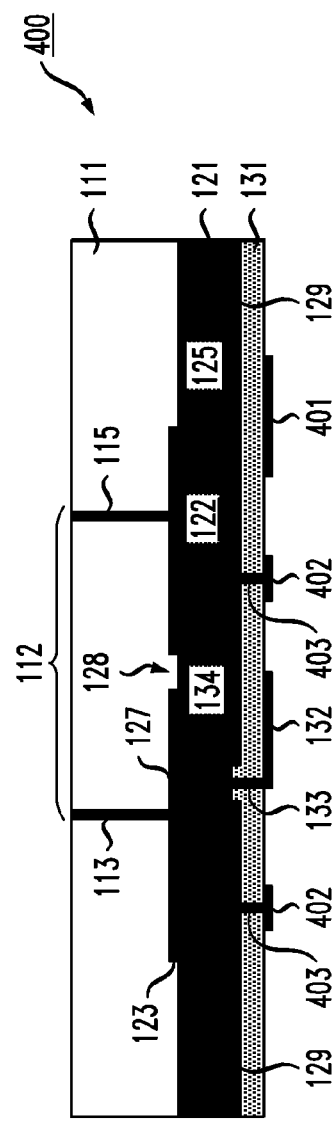
FIG. 4 schematically depicts an antenna package according to another exemplary embodiment of the invention.

It is to be further appreciated that exemplary antennas according to exemplary embodiments of the invention, can be integrally packaged with IC chips in relatively small packages to construct RF or wireless communications chips. In this regard, antenna feed lines and other power or signal lines can be fabricated on one or more additional antenna package levels as needed for the given application. For instance, FIG. 4 schematically depicts an antenna package (400) which is similar to that shown in FIG. 1A, but with additional signal, control, power supply and ground traces on the lower package level (130). In particular, as shown in FIG. 4, a plurality of ground pads (402) may be formed on the bottom of the insulating layer (131) with vias (403) connecting the ground pads (402) to the ground plane (129) (or waveguide bottom wall). The ground pads (402) can serve as connections to ground pads on a PCB or directly to a RF chip that is flip chip bonded to layer (131). In addition, FIG. 4 shows a metallic pad (401) formed on the bottom of layer (131) which can serve as a signal, power or control pad that connects to signal lines on a PCB and an RF chip that is flip chip bonded to the bottom layer (131).

Figure 5:
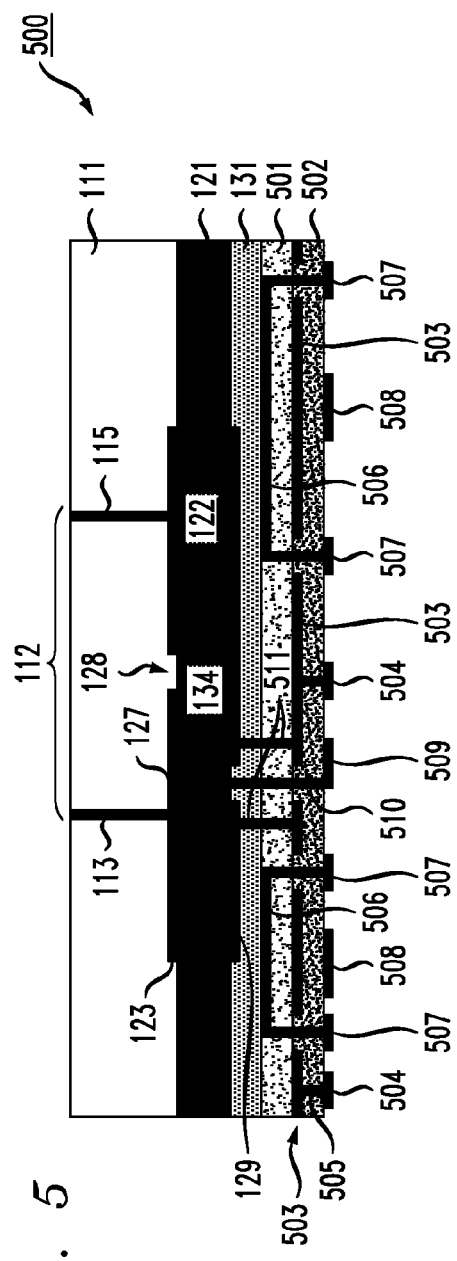
FIG. 5 schematically depicts an antenna package according to another exemplary embodiment of the invention.

In other exemplary embodiments of the invention, additional package levels may be added at the bottom of the antenna package structure to accommodate package designs with many inputs and/or outputs (I/Os). For instance, FIG. 5 schematically illustrates an antenna package structure (500) according to another exemplary embodiment of the invention having additional metallization layers to provide additional space for signal, control, and power supply and ground traces on the bottom of the package. In particular, as shown in FIG. 5, additional package layers (501) and (502) are formed at the bottom of layer 131 to implement metallic traces and lines and contact pads. For instance, the package (500) includes a separate ground plane (503) formed between layers 501 and 502. A plurality of ground pads (504) are connected to the ground plane (503) by vias (505). A metal layer disposed between layers (131) and (501) is patterned to provide control signal/power supply lines (506) as needed, which connect to contact pads (507) formed at bottom of layer (502) by vertical vias that pass through apertures formed in the ground plane (503). Further, metallic traces or pads (508) are formed on bottom of layer (502) to serve as low frequency or control signal lines connecting a PCB to an RF chip flip chip bonded to bottom of layer (502) (as will be discussed below with reference to FIG. 6).

Furthermore, in the exemplary antenna package (500) of FIG. 5, a vertical coaxial transition structure is included as a feed line to the waveguide (122). A feed line (509) formed on the bottom of layer (502) is connected to a center probe pin (510) that extends through layers 502, 501 and 131 into the waveguide (122) through the aperture (134) of the bottom wall (129) of the waveguide (122). An outside ground shield (wall) (511) of the coaxial transition may be formed with metallic vias (511) connecting the ground plane (503) and bottom plate (129) of the waveguide (122). This type of transition is appropriate for mmWave applications and based on simulations, it is believed that at least three ground (or shield) vias are suitable for good performance.

Figure 6:
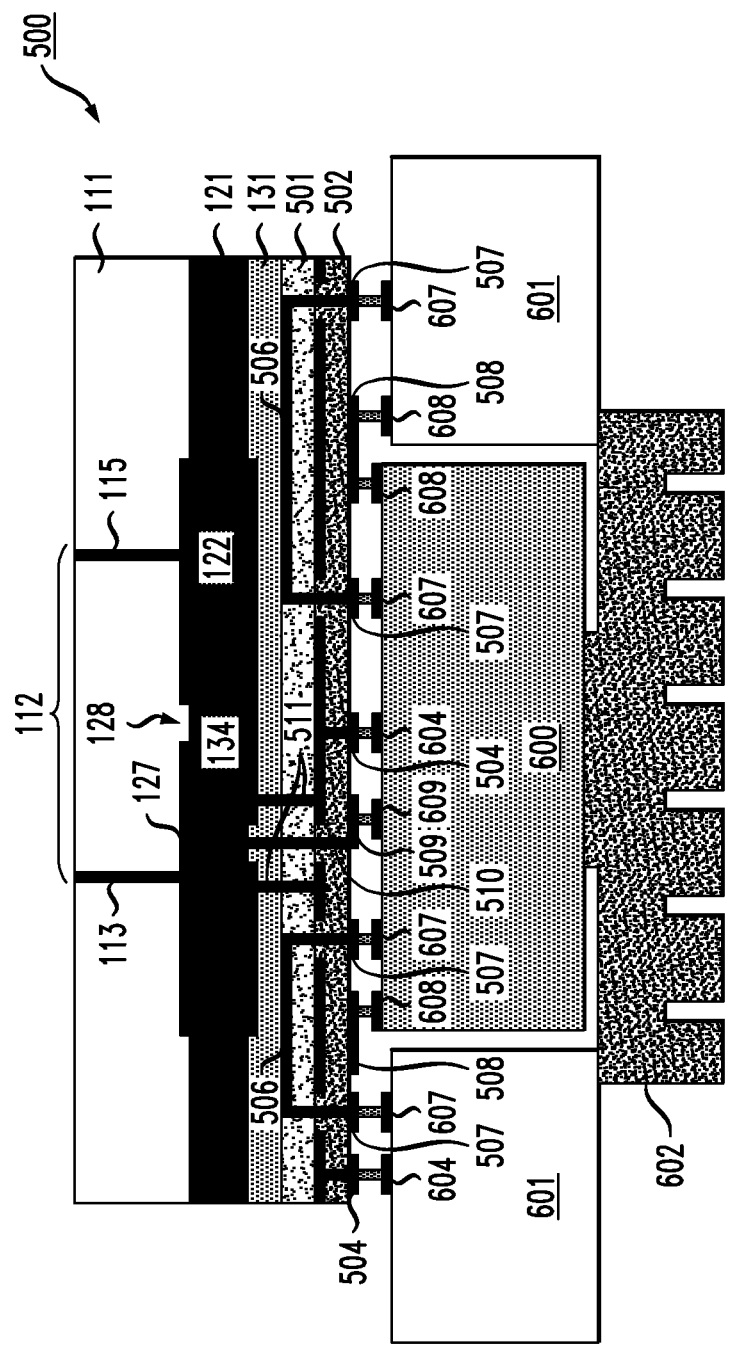
FIG. 6 schematically depicts an an integrated circuit chip package with an integrated antenna according to an exemplary embodiment of the invention.

FIG. 6 schematically depicts an an integrated circuit chip package with an integrated antenna according to an exemplary embodiment of the invention. More specifically, FIG. 6 schematically depicts an integrated circuit chip (600) flip chip bonded directly to the bottom layer (502) of the exemplary antenna package (500) of FIG. 5. In addition, FIG. 6 shows the antenna package (500) bonded to a printed circuit board (601) having a cutout in which the IC chip (600) (e.g., IC transceiver) is disposed. The IC chip (600) and PCB (601) comprises a plurality of contact pads (604), (607), and (608) that are bonded to contact pads (504), (507), and (508) on bottom of layer (502) of the antenna package (500) using solder balls (e.g., C4 connections) to make the desired ground connections (to ground plane 503), control line/power supply connections (metal lines 506 and 508) between the IC chip (600) and the PCB (601). In addition, contact pad or trace (609) formed on the IC chip (600) connects directly to the antenna feed line (509) pad formed on the bottom of layer (502). In this regard, various contact pads/transmission lines formed on the printed circuit board (601) can be provided for making electrical connections between the IC chip (600) and other components, pads, transmission lines, etc., on the PC board, for example. The PC board (601) can be fabricated to have a cutout in which the IC chip (600) is inserted as shown in FIG. 6. In addition, a heat sink (602) can be thermally bonded to the chip (600).

Figure 7:
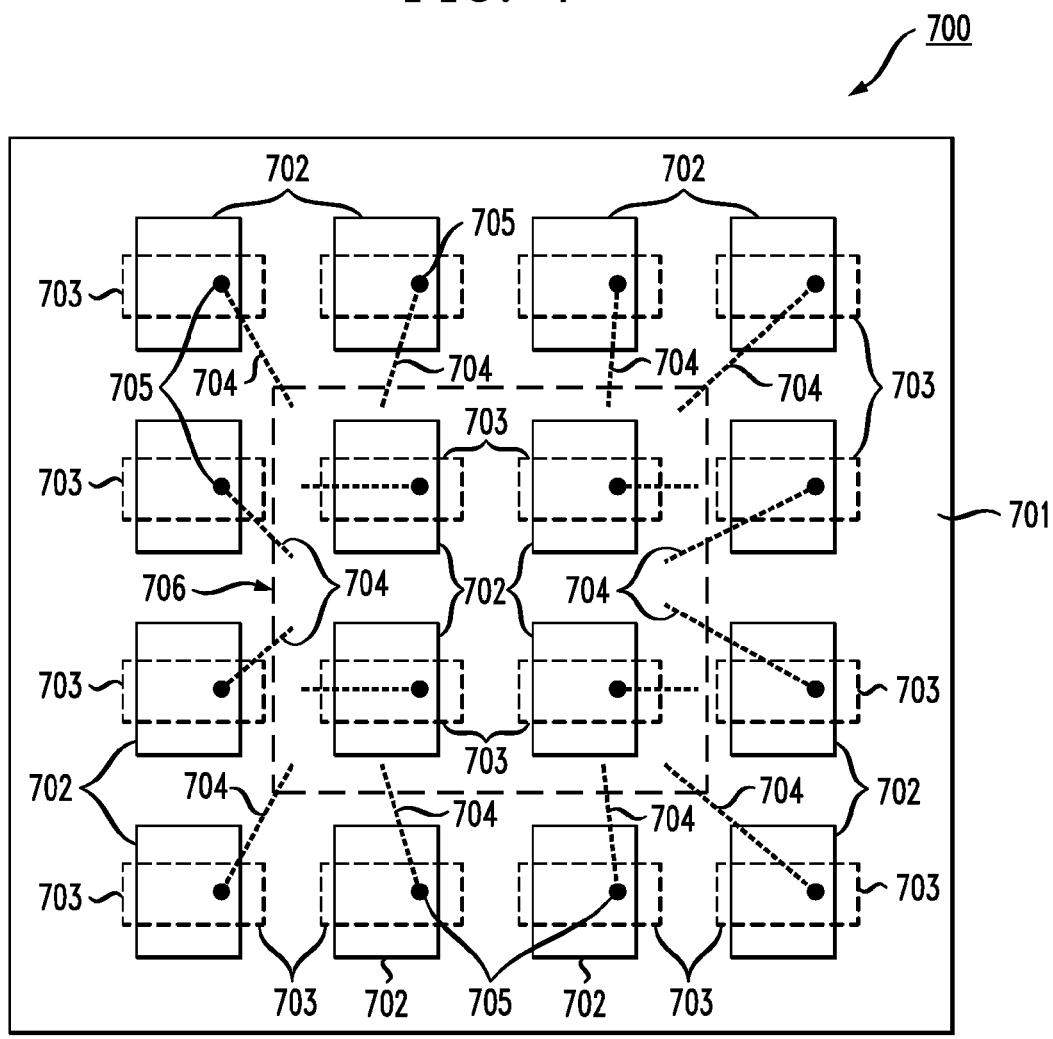
FIG. 7 schematically depicts an antenna array package according to an exemplary embodiment of the invention.

It is to be appreciated that antenna package structures according to exemplary embodiments of the invention can be packaged with IC chips to form integrated phased array antenna packages. For example, FIG. 7 schematically depicts an antenna array package according to an exemplary embodiment of the invention which can be formed with a plurality of antenna structures such as discussed above with regard to FIGS. 1 and 2, for example. In particular, FIG. 7 is a top plan view that illustrates an antenna array package (700) comprising a first package level (701) comprising an array of laminated antennas (702) and a second package level (shown in phantom) comprising an array of laminated waveguides (703). Each laminated waveguide (703) is separately formed and disposed for coupling energy to a respective one of the laminated antennas (702). In addition, a third package level comprises a plurality of antenna feed lines (704) (shown in phantom) each having a vertical probe (705) connected to an end thereof to couple energy from the antenna feed line (704) to a respective one of the laminated waveguides (703). An integrated circuit chip (706) (shown in phantom) is flip chip bonded to each of the antenna feed lines (704) of the third package level.

As discussed above with reference to FIGS. 1A/1B and 2A/2B, for example, each antenna feed line (704) may be a single microstrip line with one vertical probe that extends into a respective one of the laminated waveguides (703) through an aperture formed in a bottom wall of the laminated waveguide, or each antenna feed line (704) may be a differential feed line having two vertical probes that extend from each respective end of the differential feed line into a respective one of the laminated waveguides (703) through separate apertures formed in a bottom wall of the laminated waveguide (703). In addition, each of the exemplary antenna/waveguide/feed line structures (702, 703, 704) generically depicted in FIG. 7 may be formed having structures such as discussed above with reference to FIGS. 3, 4 and 5, as well as other frameworks as desired.

Figure 8:
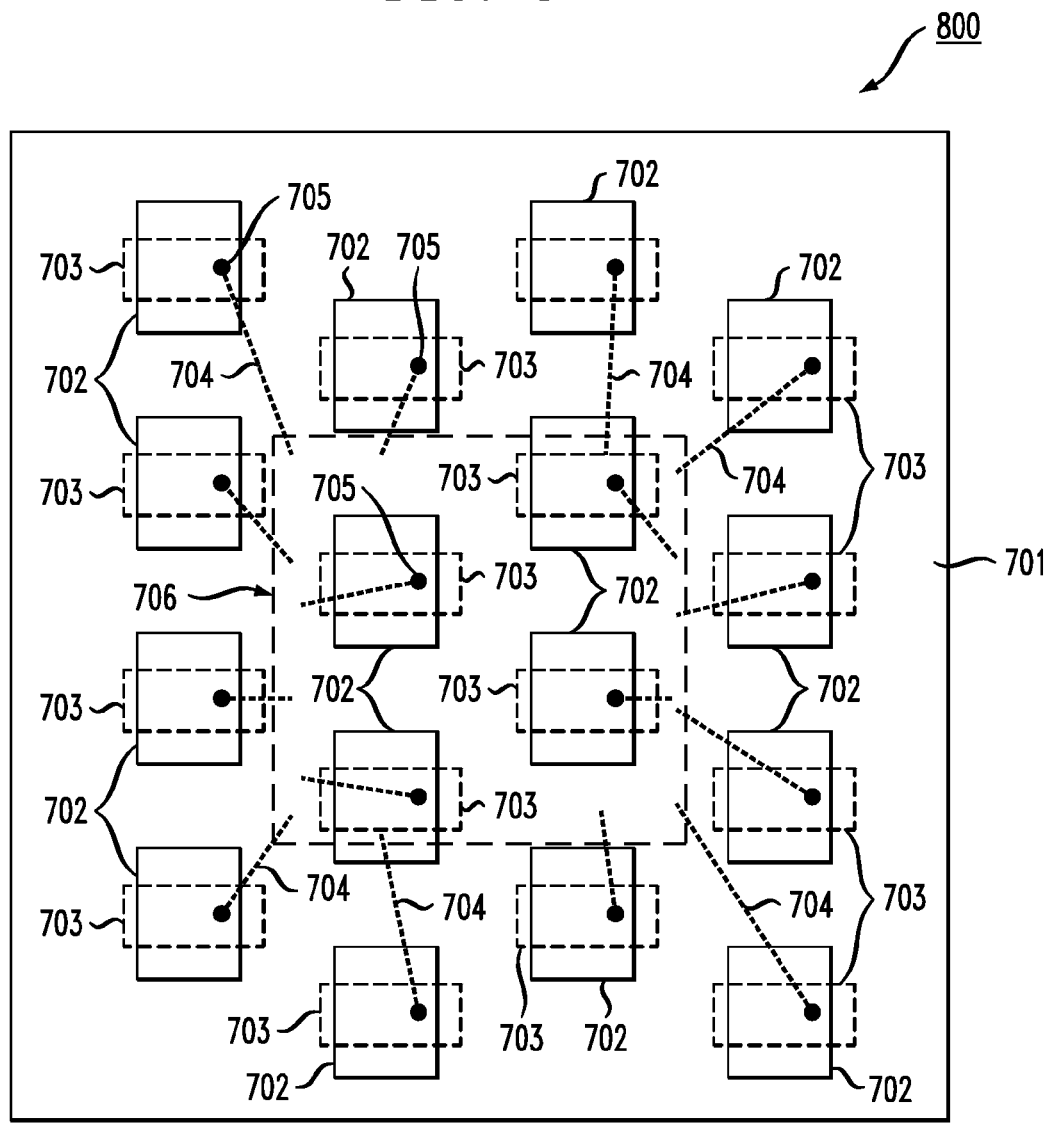
FIG. 8 schematically depicts an antenna array package according to another exemplary embodiment of the invention.

In the exemplary embodiment of FIG. 7, the laminated antennas are arranged in a rectangular array. In other exemplary embodiments of the invention, such as shown in FIG. 8, the laminated antennas are arranged in a triangular lattice shaped array. In particular, FIG. 8 schematically depicts a top plan view of an antenna array package (800) which is similar to that of FIG. 7 comprising a first package level (701) comprising an array of laminated antennas (702), a second package level (shown in phantom) comprising an array of laminated waveguides (703), a third package level comprising a plurality of antenna feed lines (704) (shown in phantom) each having a vertical probe (705) connected to an end thereof to couple energy from the antenna feed line (704) to a respective one of the laminated waveguides (703), and an integrated circuit chip (706) (shown in phantom) flip chip bonded to each of the antenna feed lines (704) of the third package level. The triangular-lattice layout in FIG. 8 may be more practical, in at least some instances, due to increased feed line layout flexibility.

Those of ordinary skill in the art will readily appreciate the various advantages associated with integrated chip/antenna package structures according to embodiments of the invention. For instance, the exemplary package structure can be readily fabricated using known techniques to enable high-volume antenna manufacturing capability. Moreover, integrated chip packages according to exemplary embodiments of the invention enable laminated antennas to be integrally packaged with IC chips such as transceiver chips, which provide compact designs with very low loss between the transceiver and the antenna. Moreover, the use of integrated antenna/IC chip packages according to the present invention saves significant space, size, cost, and weight, which is a premium for virtually any commercial or military application.

Although exemplary embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

What is claimed is:

1. An antenna package, comprising:
   a first package level comprising a laminated antenna;
   a second package level comprising a laminated waveguide for coupling energy to the laminated antenna, wherein the laminated waveguide comprises an insulating layer comprising an upper metallic wall and a bottom metallic wall on opposing sides of the insulating layer, and a plurality of metallic side walls formed within the insulating layer, wherein the upper metallic wall comprises an aperture to couple energy to the laminated antenna aligned thereto;
   a third package level comprising an antenna feed line; and
   a vertical probe connected to an end of the antenna feed line to couple energy from the antenna feed line to the laminated waveguide.

2. The antenna package of claim 1, wherein the laminated antenna comprises a filled-cavity antenna structure.

3. The antenna package of claim 1, wherein the bottom metallic wall of the laminated waveguide comprises an aperture for insertably receiving the probe that extends from the antenna feed line into the waveguide.

4. The antenna package of claim 1, wherein the antenna feed line is a microstrip line with one vertical probe that extends into the laminated waveguide through an aperture formed in a bottom wall of the laminated waveguide.

5. The antenna package of claim 1, wherein the antenna feed line is a differential feed line having two vertical probes that extend from each respective end of the differential feed line into the laminated waveguide through separate apertures formed in a bottom wall of the laminated waveguide.

6. The antenna package of claim 1, wherein the antenna feed line is a vertical coaxial type feed line having a vertical probe that extend from an end of the antenna feed line and a plurality of metallic vias that surround the vertical probe and serve as a ground shield.

7. The antenna package of claim 1, wherein a bottom metallic wall of the laminated waveguide serves as a ground plane for the antenna feed line.

8. The antenna package of claim 1, wherein vertical metallic walls of the laminated antenna are defined by a plurality of metallic vias.

9. The antenna package of claim 1, further comprising a fourth package level comprising a plurality of metallic traces and vertical vias to implement power supply and control signal lines for interfacing to an integrated circuit chip.

10. An integrated circuit chip package, comprising antenna package comprising:
    a first package level comprising a laminated antenna;
    a second package level comprising a laminated waveguide for coupling energy to the laminated antenna, wherein the laminated waveguide comprises an insulating layer comprising an upper metallic wall and a bottom metallic wall on opposing sides of the insulating layer, and a plurality of metallic side walls formed within the insulating layer, wherein the upper metallic wall comprises an aperture to couple energy to the laminated antenna aligned thereto;
    a third package level comprising an antenna feed line; and a vertical probe connected to an end of the antenna feed line to couple energy from the antenna feed line to the laminated waveguide; and an integrated circuit chip flip chip bonded the antenna feed line of the third package level.

11. The integrated circuit chip package of claim 10, wherein the laminated antenna comprises a filled-cavity antenna structure.

12. The integrated circuit chip package of claim 10, wherein the antenna feed line is a microstrip line with one vertical probe that extends into the laminated waveguide through an aperture formed in a bottom wall of the laminated waveguide.

13. The integrated circuit chip package of claim 10, wherein the antenna feed line is a differential feed line having two vertical probes that extend from each respective end of the differential feed line into the laminated waveguide through separate apertures formed in a bottom wall of the laminated waveguide.

14. The integrated circuit chip package of claim 10, wherein the antenna feed line is a vertical coaxial type feed line having a vertical probe that extend from an end of the antenna feed line and a plurality of metallic vias that surround the vertical probe and serve as a ground shield.

15. The integrated circuit chip package of claim 10, wherein a bottom metallic wall of the laminated waveguide serves as a ground plane for the antenna feed line.

16. The integrated circuit chip package of claim 10, wherein vertical metallic walls of the laminated antenna are defined by a plurality of metallic vias.

17. The integrated circuit chip package of claim 10, further comprising a fourth package level comprising a plurality of metallic traces and vertical vias to implement power supply and control signal lines for interfacing the integrated circuit chip to a printed circuit board.

18. The integrated circuit chip package of claim 10, wherein the integrated circuit chip is disposed in a cut out region of the printed circuit board.

19. An antenna array package, comprising:
a first package level comprising an array of laminated antennas;
a second package level comprising an array of laminated waveguides, each laminated waveguide being separately formed and disposed for coupling energy to a respective one of the laminated antennas, wherein the second package level comprises an insulating layer comprising an upper metallic wall and a bottom metallic wall on opposing sides of the insulating layer, and a plurality of metallic side walls formed within the insulating layer defining separate waveguides that correspond to the laminated antennas, wherein the upper metallic wall comprises a plurality of apertures to couple energy to corresponding laminated antennas aligned thereto; and
a third package level comprising a plurality of antenna feed lines each having a vertical probe connected to an end thereof to couple energy from the antenna feed line to a respective one of the laminated waveguides.

20. An antenna array package of claim 19, wherein the laminated antennas comprise filled-cavity antenna structures.

21. The antenna array package of claim 19, wherein each antenna feed line is a microstrip line with one vertical probe that extends into a respective one of the laminated waveguides through an aperture formed in a bottom wall of the laminated waveguide.

22. The antenna array package of claim 19, wherein the each antenna feed line is a differential feed line having two vertical probes that extend from each respective end of the differential feed line into a respective one of the laminated waveguides through separate apertures foamed in a bottom wall of the laminated waveguide.

23. The antenna package of claim 19, wherein the array of laminated antennas are arranged in a rectangular array.

24. The antenna array package of claim 19, wherein the array of laminated antennas is arranged in a triangular lattice shaped array.

25. An integrated circuit chip package comprising:
an antenna array comprising:
a first package level comprising an array of laminated antennas;
a second package level comprising an array of laminated waveguides, each laminated waveguide being separately formed and disposed for coupling energy to a respective one of the laminated antennas, wherein the second package level comprises an insulating layer comprising an upper metallic wall and a bottom metallic wall on opposing sides of the insulating layer, and a plurality of metallic side walls formed within the insulating layer defining separate waveguides that correspond to the laminated antennas, wherein the upper metallic wall comprises a plurality of apertures to couple energy to corresponding laminated antennas aligned thereto; and
a third package level comprising a plurality of antenna feed lines each having a vertical probe connected to an end thereof to couple energy from the antenna feed line to a respective one of the laminated waveguides; and
an integrated circuit chip flip chip bonded to each of the antenna feed lines of the third package level.

* * * * *